United States Patent

Segawa et al.

[11] Patent Number: 5,239,214
[45] Date of Patent: Aug. 24, 1993

[54] OUTPUT CIRCUIT AND DATA TRANSFER DEVICE EMPLOYING THE SAME

[75] Inventors: Reiji Segawa, Matsubara; Ichiro Okabayashi, Takatsuki, both of Japan

[73] Assignee: Matsushita Electric Industrial Co., Ltd., Osaka, Japan

[21] Appl. No.: 750,119

[22] Filed: Aug. 26, 1991

[30] Foreign Application Priority Data

Sep. 3, 1990 [JP] Japan ................................. 2-233540

[51] Int. Cl.$^5$ ............................................ H03K 19/00
[52] U.S. Cl. ...................................... 307/473; 307/451; 307/465; 307/468; 307/469
[58] Field of Search ............... 307/473, 451, 465, 468, 307/469, 441, 465.1, 482.1

[56] References Cited

U.S. PATENT DOCUMENTS

| | | | |
|---|---|---|---|
| 4,920,515 | 4/1990 | Obata | 307/465 |
| 5,003,205 | 3/1991 | Kohda | 307/465 |
| 5,081,374 | 1/1992 | Davis | 307/473 |
| 5,087,840 | 2/1992 | Davies | 307/473 |

Primary Examiner—Robert J. Pascal
Assistant Examiner—R. A. Ratliff
Attorney, Agent, or Firm—Wenderoth, Lind & Ponack

[57] ABSTRACT

An output circuit for a data transfer device includes first and second control inputs, a data input and a data output. The first control input controls whether the data output is generated in accordance with an ordinary type or an open drain type circuit operation, while the second control input controls whether the data output generated in accordance with the ordinary type circuit operation is set to an active state or an inactive state.

5 Claims, 7 Drawing Sheets

OUTPUT CIRCUIT AND DATA TRANSFER DEVICE EMPLOYING THE SAME

BACKGROUND OF THE INVENTION

The present invention relates to an output circuit and a data transfer device which are used in a semiconductor integrated circuit.

Conventionally, a tri-state type output circuit and an open drain type output circuit have been employed separately. In a parallel processing system which is currently being developed by the present inventors, it is necessary to perform one-to-one transfer in which data is transferred from a data transfer circuit to one of a plurality of data reception circuits and broadcast transfer in which data is transferred from the data transfer circuit to all of a plurality of the data reception circuits. At the time of data transfer, the data reception circuits inform, by using a flag signal indicative of an internal state of each of the data reception circuits, the data transfer circuit whether or not data reception is possible. In the case where an output circuit of this flag signal is constituted by a tri-state type output circuit, the flag signal is connected to the data transfer circuit through each data reception circuit. At the time of broadcast transfer, the data transfer circuit takes a logical product of all the flag signals so as to judge whether or not data transfer is possible. On the other hand, in the case where an output circuit of the flag signal is constituted by an open drain type output circuit, the flag signals from the respective data reception circuits are used through wired connection but a pull-up resistance for pulling up and maintaining each flag signal at a sufficiently high level must be provided.

Thus, in the known data transfer device employing the tri-state type output circuits, the number of flag signals increases in response to an increase of the number of data reception circuits and the circuit for taking the logical product of the flag signals is also made complicated, thereby resulting in an excessively large circuit area. Meanwhile, since the number of data reception circuits has a tendency to increase in the future, the number of signal lines will be increased more and more and thus, a serious problem arises as the circuit area increases.

On the other hand, in the known data transfer device employing the open drain type output circuits, the pull-up resistance is used for pulling up and maintaining to a high level the signal obtained by wired connection of the flag signals. At this time, contradictory demands for reduction of the pull-up resistance so as to increase the operational speed and for increase of the pull-up resistance so as to reduce power consumption are made, and the pull-up resistance comes close to its limit in a high-speed integrated circuit of low power consumption.

SUMMARY OF THE INVENTION

Accordingly, an essential object of the present invention is to provide an output circuit which is capable of acting not only as a tri-state type output circuit but also as an open drain type output circuit.

Meanwhile, another important object of the present invention is to provide a data transfer device which, by employing this output circuit, not only reduces the number of wires but is also capable of operating at a high speed.

In order to accomplish this object of the present invention, an output circuit embodying the present invention has first and second control inputs, a data input and a data output; the first control input controlling whether the data output is generated in accordance with an ordinary type or an open drain type circuit operation, while the second control input controls whether the data output generated in accordance with the ordinary type circuit operation is set to an active state or an inactive state.

Furthermore, the present invention provides a data transfer device comprising: a data transfer circuit which includes an input circuit and from which a data line and a plurality of address lines are led; the input circuit having a pull-up circuit for setting an input signal line to a pull-up state by an output control line; and a plurality of data reception circuits each of which includes an output circuit such that outputs of the output circuits are applied to the input signal line in common; the output circuits each having first and second control inputs, a data input and a data output; the first control input controlling whether the data output is generated in accordance with an ordinary type or an open drain type circuit operation, while the second control input controls whether the data output generated in the ordinary type is set to an active state or an inactive state; the data line being connected to the data reception circuits in common; the address lines being, respectively, connected to the data reception circuits; the output control line being led from the data transfer circuit so as to be connected to the data reception circuits in common; wherein the output control line controls whether the outputs of the output circuits are generated in accordance with the ordinary type circuit operation or the open drain type, while the address lines control whether the outputs of the output circuits are set to the active state or the inactive state.

By the above described arrangement of the output circuit according to the present invention, a tri-state type output circuit and an open drain type output circuit can be achieved by a single circuit.

As a result, in the data transfer device of the above described arrangement according to the present invention, the number of wires for the flag signals can be greatly reduced as compared with a data transfer device employing a tri-state type output circuit, and a circuit for taking a logical product of the flag signals is not required, thereby resulting in higher integration of the circuit. Meanwhile, in the data transfer device of the present invention, since the output circuit can act as a tri-state type output circuit at the time of one-to-one transfer occupying a large portion of data transfer, the data transfer device can be operated at a higher speed than a data transfer device employing an open drain type output circuit. Furthermore, in the data transfer device of the present invention, since the pull-up circuit is turned off at the time of one-to-one transfer, power consumption is reduced as compared with the data transfer device employing the open drain type output circuit.

BRIEF DESCRIPTION OF THE DRAWINGS

These objects and features of the present invention will become apparent from the following description taken in conjunction with the preferred embodiments thereof with reference to the accompanying drawings, in which.

DETAILED DESCRIPTION OF THE INVENTION

Figure 1:
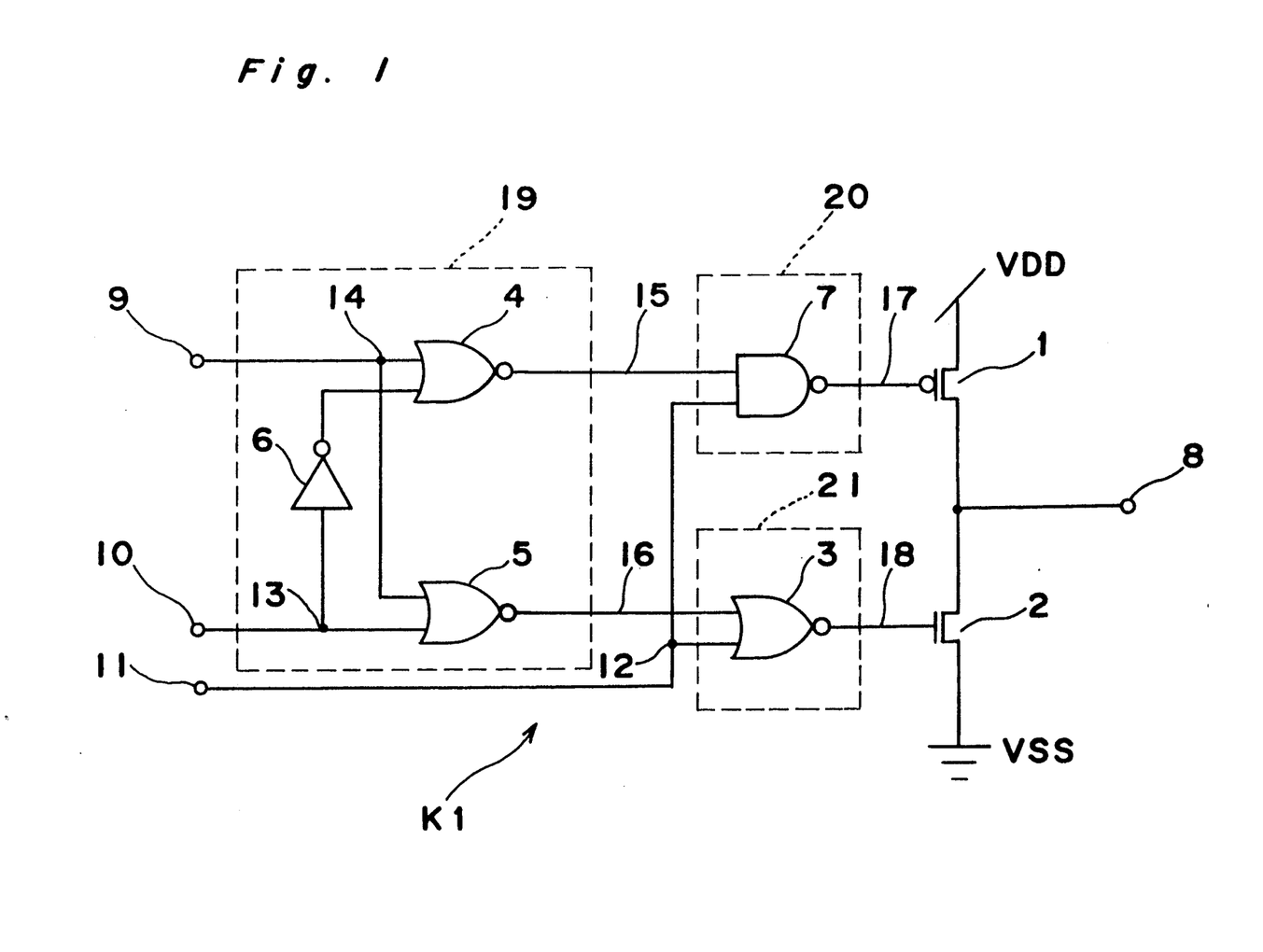
FIG. 1 is a diagram of an output circuit according to a first embodiment of the present invention.

Referring now to the drawings, there is shown in FIG. 1 an output circuit K1 according to a first embodiment of the present invention. The output circuit K1 includes a P type MOS transistor 1 acting as a first switching element, an N type MOS transistor 2 acting as a second switching element, three two-input NOR circuits 3 to 5, an inverter circuit 6, a two-input NAND circuit 7, four terminals 8 to 11, a first control circuit 19, a second control circuit 20 and a third control circuit 21. A control signal OD acting as a first control input is applied to the terminal 9 and a control signal EN acting as a second control input is applied to the terminal 10. Meanwhile, a data signal Din is inputted to the terminal 11.

The P type MOS transistor 1 is connected between a power source VDD and the terminal 8, while the N type MOS transistor 2 is connected between an earth terminal VSS and the terminal 8. The gate of the P type MOS transistor 1 is connected to the output of the NAND circuit 7, while the inputs of the NAND circuit 7 are, respectively, connected to the output of the NOR circuit 4 and a contact 12. The inputs of the NOR circuit 4 are, respectively, connected to a contact 14 and a signal obtained by inverting the control signal EN by the inverter circuit 6. The gate of the N type MOS transistor 2 is connected to the output of the NOR circuit 3, while the inputs of the NOR circuit 3 are, respectively, connected to the contact 12 and the output of the NOR circuit 5. The inputs of the NOR circuit 5 are, respectively, connected to contacts 13 and 14. The contacts 14, 13 and 12 are, respectively, connected to the terminal 9 for receiving the control signal OD, the terminal 10 for receiving the control signal EN and the terminal 11 for receiving the data signal Din.

Figure 2:
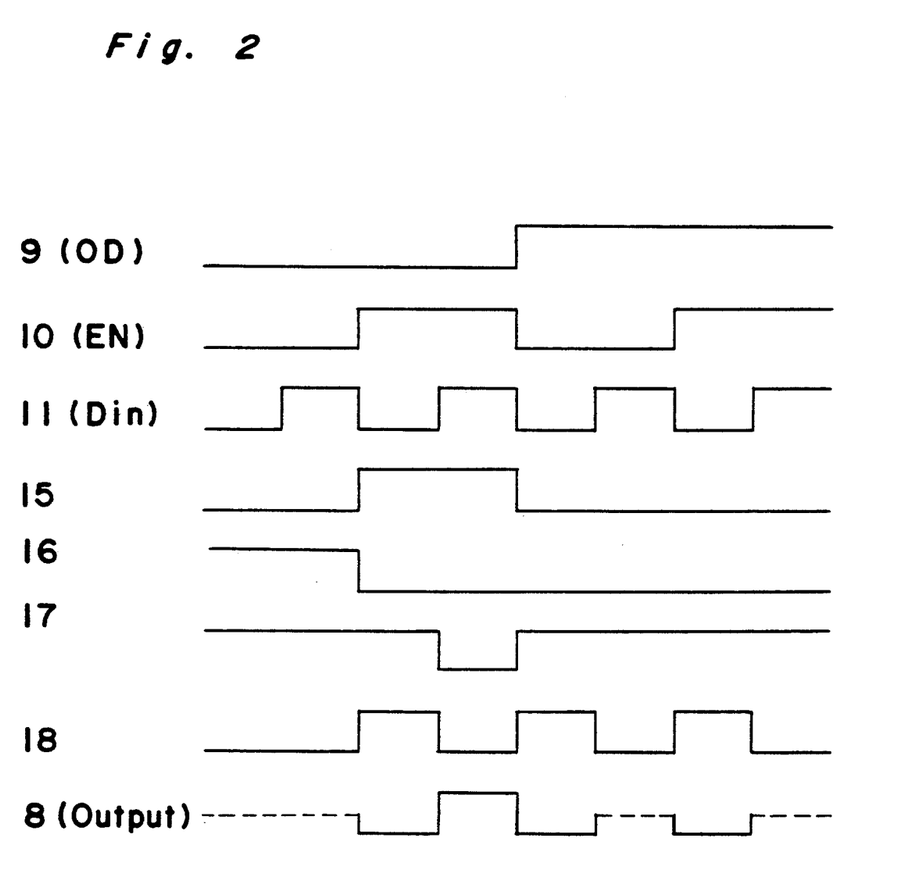
FIG. 2 is a chart showing an operation of the output circuit of FIG. 1.

The operation of the output circuit K1 is described with reference to FIG. 2. If the control signal OD is at high level (hereinbelow, referred to as "H"), the output 15 of the NOR circuit 4 becomes a low level (hereinbelow, referred to as "L"), so that the output of the NAND circuit 7 becomes "H" and thus, the P type MOS transistor 1 is turned off. Meanwhile, at this time, since the output 16 of the NOR circuit 5 becomes "L", "L" is applied to one input of the NOR circuit 3. Thus, when the data signal Din is at "H", the output 18 of the NOR circuit 3 becomes "L" and the N type MOS transistor 2 is turned off. On the contrary, when the data signal Din is at "L", the output 18 of the NOR circuit 18 becomes "H" and thus, the N type MOS transistor 2 is turned on.

If the control signal OD is at "L" and the control signal EN is at "L", the output 15 of the NOR circuit 4 becomes "L", so that the output 17 of the NAND circuit 7 becomes "H" and thus, the P type MOS transistor 1 is turned off. Meanwhile, at this time, since the output 16 of the NOR circuit 5 becomes "H", "H" is applied to one input of the NOR circuit 3 and thus, the N type MOS transistor 2 is turned off.

If the control signal OD is at "L" and the control signal EN is at "H", the output 15 of the NOR circuit 4 becomes "H" and thus, "H" is applied to one input of the NAND circuit 7. Therefore, when the data signal Din is at "H", the output 17 of the NAND circuit 7 becomes "L" and thus, the P type MOS transistor 1 is turned on. On the other hand, when the data signal Din is at "L", the output 17 of the NAND circuit 7 becomes "H" and thus, the P type MOS transistor 1 is turned off. Meanwhile, at this time, since the output 16 of the NOR circuit 5 becomes "L", "L" is applied to one input of the NOR circuit 3. Hence, when the data signal Din is at "H", the output 18 of the NOR circuit 3 becomes "L" and thus, the N type MOS transistor 2 is turned off. When the data signal Din is at "L", the output 18 of the NOR circuit 3 becomes "H" and thus, the N type MOS transistor 2 is turned on.

As described above, in the output circuit K1 of the present invention, when the control signal OD inputted to the terminal 9 is at "H", the output circuit K1 acts as an open drain type output circuit. On the other hand, when the control signal OD is at "L", the output circuit K1 acts as a tri-state type output circuit. Meanwhile, in this embodiment, since the P type and N type MOS transistors 1 and 2 provided at a final stage can have a large drive capacity, the output circuit K1 can be especially effectively used as an output pad circuit.

Figure 3:
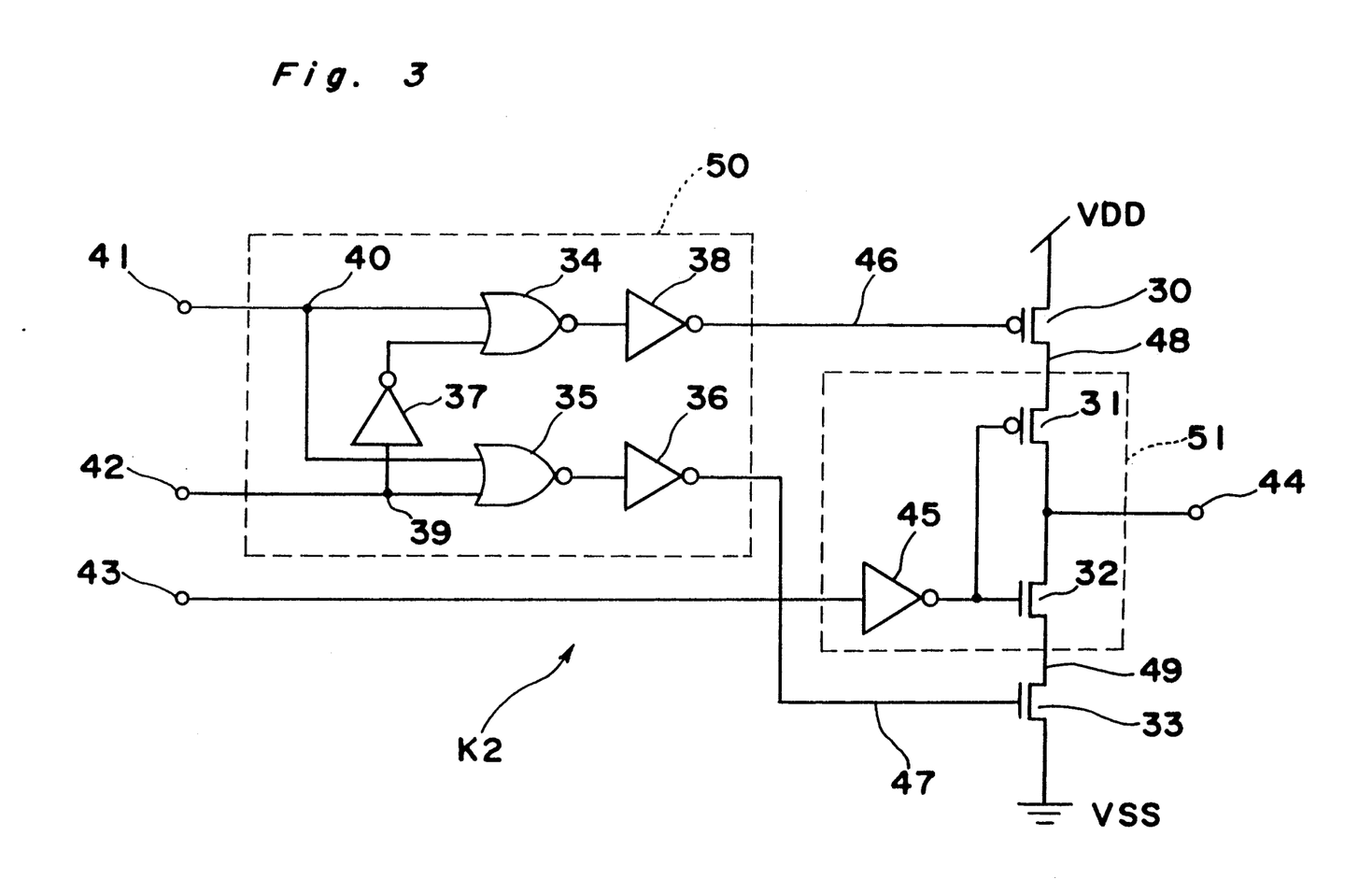
FIG. 3 is a diagram of an output circuit according to a second embodiment of the present invention.

FIG. 3 shows an output circuit K2 according to a second embodiment of the present invention. The output circuit K2 includes a P type MOS transistor 30 acting as a first switching element, a P type MOS transistor 31, an N type MOS transistor 32, an N type MOS transistor 33 acting as a second switching element, two two-input NOR circuits 34 and 35, four inverter circuits 36 to 38 and 45, a control circuit 50, a logical circuit 51 and four terminals 41 to 44. The control signal OD acting as a first control input is applied to the the terminal 41 and the control signal EN acting as a second control input is applied to the terminal 42. Meanwhile, the data signal Din is inputted to the terminal 43.

The P type MOS transistors 30 and 31 are connected in series between the power source VDD and the terminal 44. The N type MOS transistors 32 and 33 are connected in series between the earth terminal VSS and the terminal 44. The gate of the P type MOS transistor 30 is connected to a signal obtained by inverting the output of the NOR circuit 34 by the inverter circuit 38. The inputs of the NOR circuit 34 are, respectively, connected to a contact 40 and a signal obtained by inverting the control signal EN by the inverter circuit 37. The gate of the N type MOS transistor 33 is connected to a signal obtained by inverting the output of the NOR circuit 35 by the inverter circuit 36. The inputs of the NOR circuit 35 are, respectively, connected to contacts 39 and 40. The gate of the P type MOS transistor 31 and the gate of the N type MOS transistor 32 are commonly connected to the output of the inverter circuit 45, while the input of the inverter circuit 45 is connected to the terminal 43. The contacts 40 and 39 are, respectively, connected to the terminal 41 for receiving the control signal OD and the terminal 42 for receiving the control signal EN.

Figure 4:
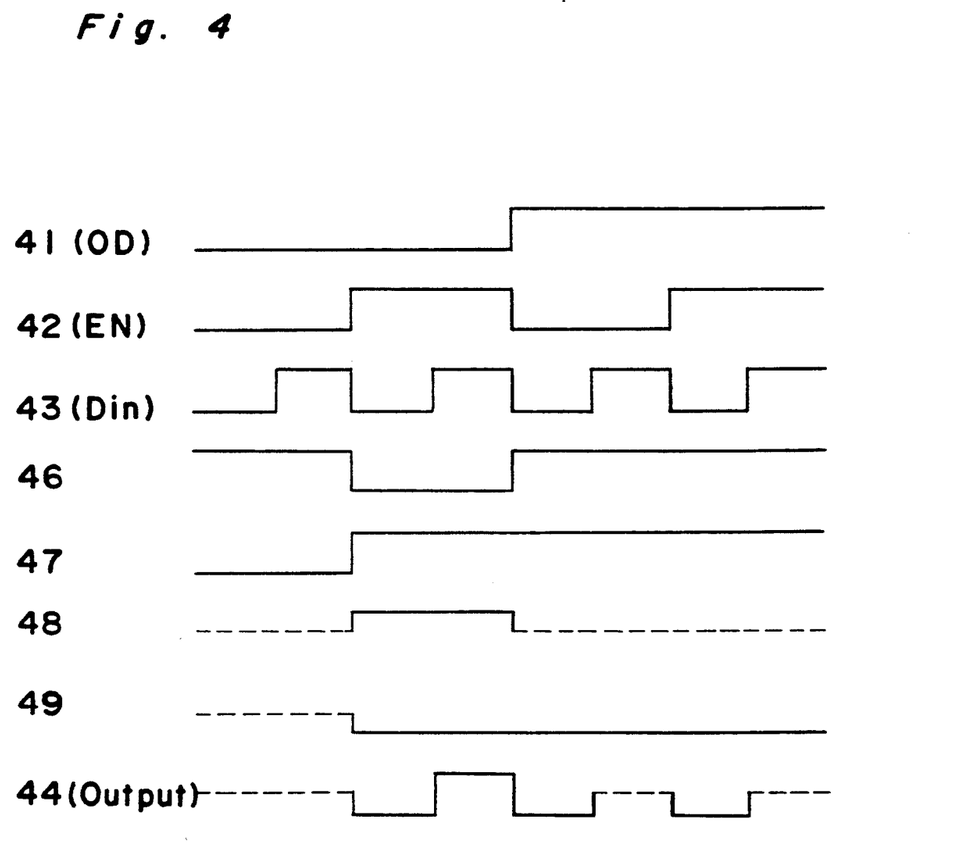
FIG. 4 is a chart showing an operation of the output circuit of FIG. 3.

The operation of the output circuit K2 is described with reference to FIG. 4. Irrespective of the control signals EN and OD, the P type MOS transistor 31 is turned on and off when the data signal Din is at "H" and "L", respectively. Irrespective of the control signals EN and OD, the N type MOS transistor 32 is turned off and on when the data signal Din is at "H" and "L", respectively. If the control signal OD is at "H", the output of the NOR circuit 34 becomes "L", so that the output 46 of the inverter circuit 38 becomes "H" and thus, the P type MOS transistor 30 is turned off. Meanwhile, at this time, since the output of the NOR circuit 35 becomes "L", the output 47 of the inverter circuit 36 assumes "H" and thus, the N type MOS transistor 33 is turned on.

When the control signal OD is at "L" and the control signal EN is at "L", the output of the NOR circuit 34 becomes "L", so that the output 46 of the inverter circuit 38 becomes "H" and thus, the P type MOS transistor 30 is turned off. Meanwhile, at this time, since the output of the NOR circuit 35 becomes "H", the output 47 of the inverter circuit 36 becomes "L" and thus, the N type MOS transistor 33 is turned off.

When the control signal OD is at "L" and the control signal EN is at "H", the output of the NOR circuit 34 becomes "H", so that the output 46 of the inverter circuit 38 becomes "L" and thus, the P type MOS transistor 30 is turned on. Meanwhile, at this time, since the output of the NOR circuit 35 becomes "L", the output 47 of the inverter circuit 36 becomes "H" and thus, the N type MOS transistor 33 is turned on.

As described above, in the output circuit K2 of the present invention, when the control signal OD applied to the terminal 41 is at "H", the output circuit K2 acts as an open drain type output circuit. On the other hand, when the control signal OD is at "L", the output circuit K2 acts as a tri-state type output circuit. Therefore, in this embodiment, the tri-state type output circuit and the open drain type output circuit can be achieved by a small number of the transistors, thereby resulting in reduction of the circuit area.

Figure 5:
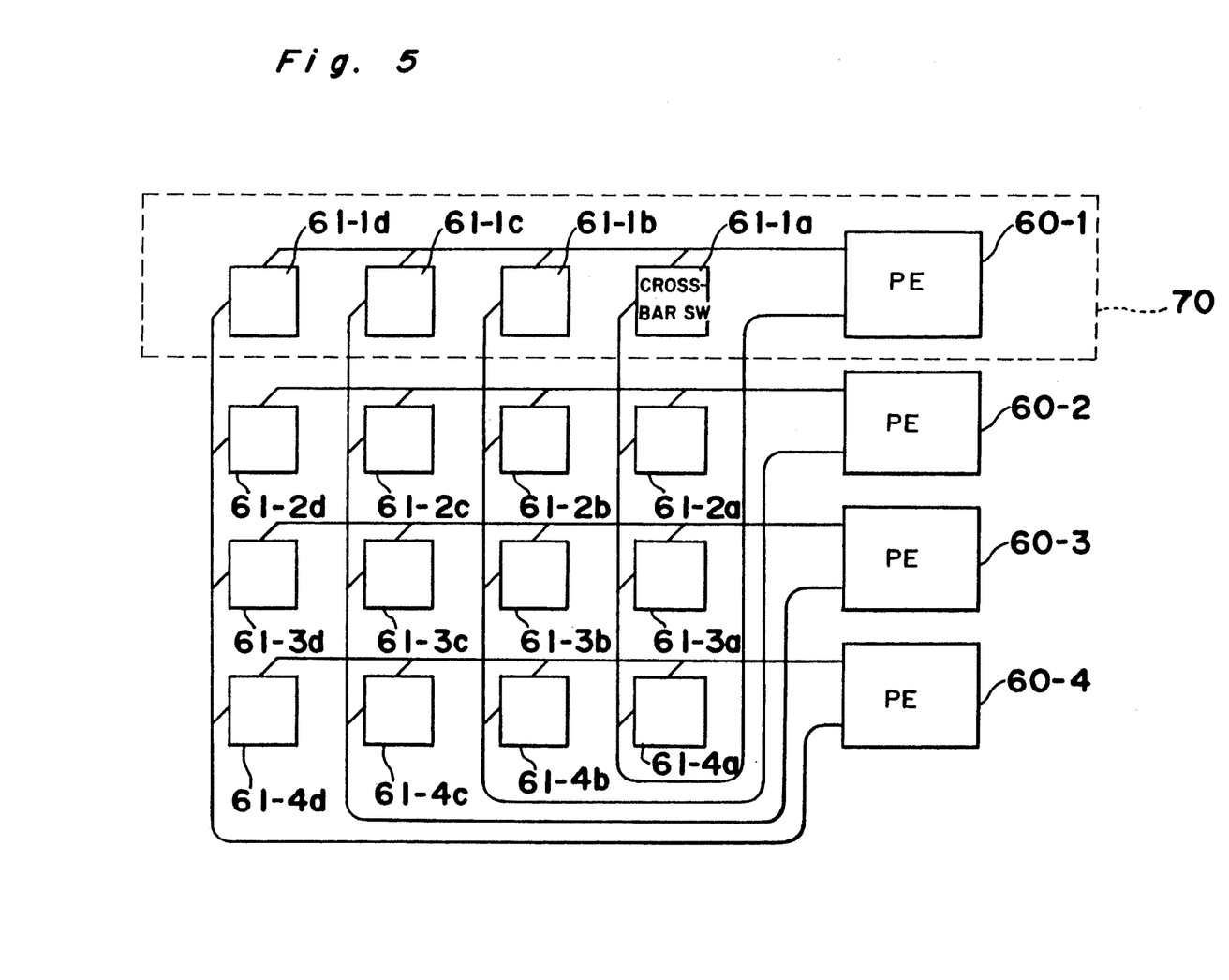
FIG. 5 is a view showing a configuration of a parallel processing system employing a data transfer device of the present invention.

FIG. 5 shows configuration of a parallel processing system employing a data transfer device 70 in another aspect of the present invention. In the parallel processing system, four processor elements (PE) 60-1 to 60-4 are connected by a 4×4 network of crossbar switches 61-1a to 61-4d. The data transfer device 70 is constituted by the processor element 60-1 and the crossbar switches 61-1a to 61-1d.

Figure 6:
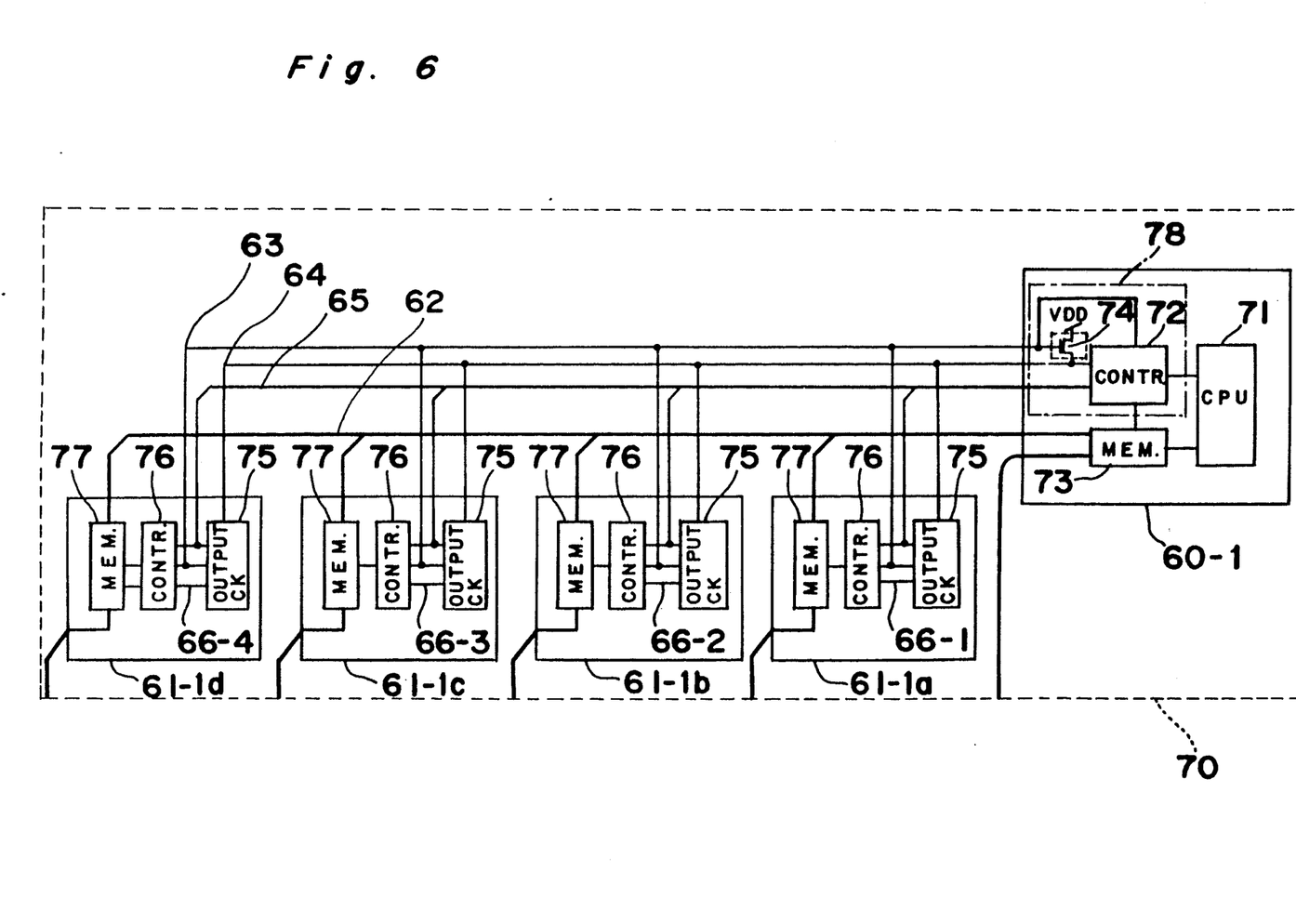
FIG. 6 is a circuit diagram of the data transfer device of FIG. 5.

FIG. 6 shows the data transfer device 70 of the present invention. The processor element 60-1 acting as a data transfer circuit is constituted by a CPU 71, a memory 73 and an input circuit 78. The input circuit 78 includes a controller 72 and a pull-up circuit 74. Meanwhile, each of the crossbar switches 61-1a to 61-1d, which act as a data reception circuit, is constituted by a flag signal output circuit 75 of the present invention, a memory 77 and a controller 76. The processor element 60-1 and the crossbar switches 61-1a to 61-1d are commonly connected by a data bus 62, an output control line 63 for delivering a broadcast signal and an input signal line 64 for delivering a flag signal. An address bus 65 is connected from the processor element 60-1 to the crossbar switches 61-1a to 61-1d. The output control line 63 is connected to the pull-up circuit 74 formed by an N type MOS transistor, while the input signal line 64 is connected to the controller 72. The output control line 63 is applied to a first control input of the output circuit 75, while the address bus 65 is applied to a second control input of the output circuit 75. The output control line 63 controls the output circuit 75 so as to determine whether the output of the output circuit 75 is generated in accordance with an ordinary type or an open drain type circuit, while the address bus 65 controls the output circuit 75 so as to determine whether output of the output circuit 75 is set to an active state or an inactive state.

Figure 7:
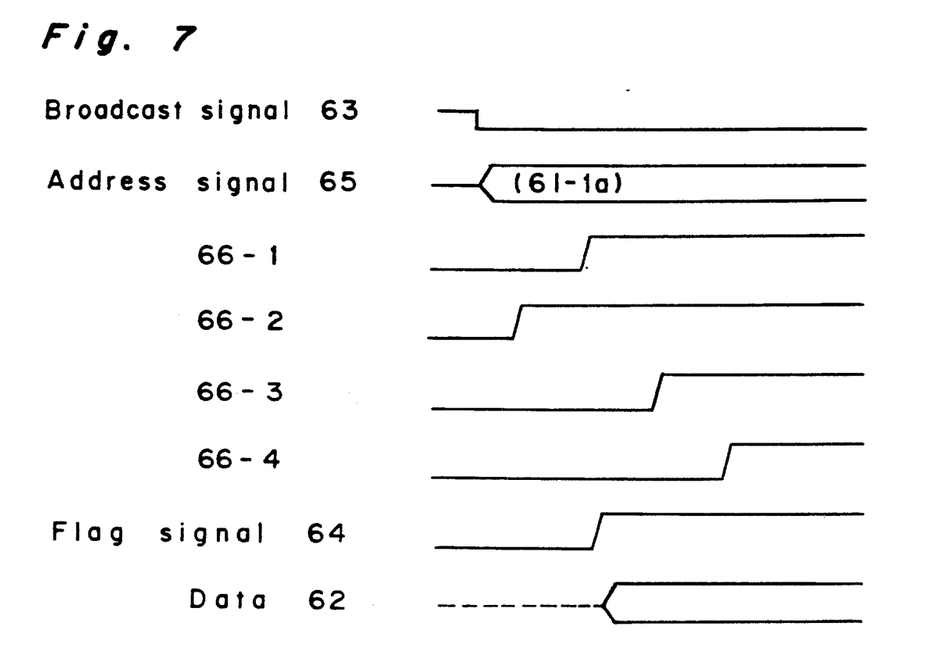
FIG. 7 is a chart showing an operation of the data transfer device of FIG. 6 at the time of one-to-one transfer.

The operation of the data transfer device 70 is now described. If the broadcast signal 63 is at "L", namely, one-to-one transfer is performed, the pull-up N type MOS transistor 74 of the processor element 60-1 is turned off. Meanwhile, the output circuit 75 acts as a tri-state type output circuit. Thus, only the output circuit 75 of the crossbar switch 61-1a designated by the address signal 65 is activated so as to deliver, as a flag signal 64, to the processor element 60-1, a signal 66-1 outputted by the controller 76 in accordance with its internal state and indicative of whether or not data reception is possible. In response to the flag signal 64, the controller 72 of the processor element 60-1 requests the memory 73 to output data. In response to the request, data is outputted to the data bus 62 by the memory 73 and is received from the data bus 62 by the crossbar switch 61-1a. FIG. 7 shows one-to-one transfer of the data transfer device 70 in the case where the crossbar switch 61-1a has been designated.

Figure 8:
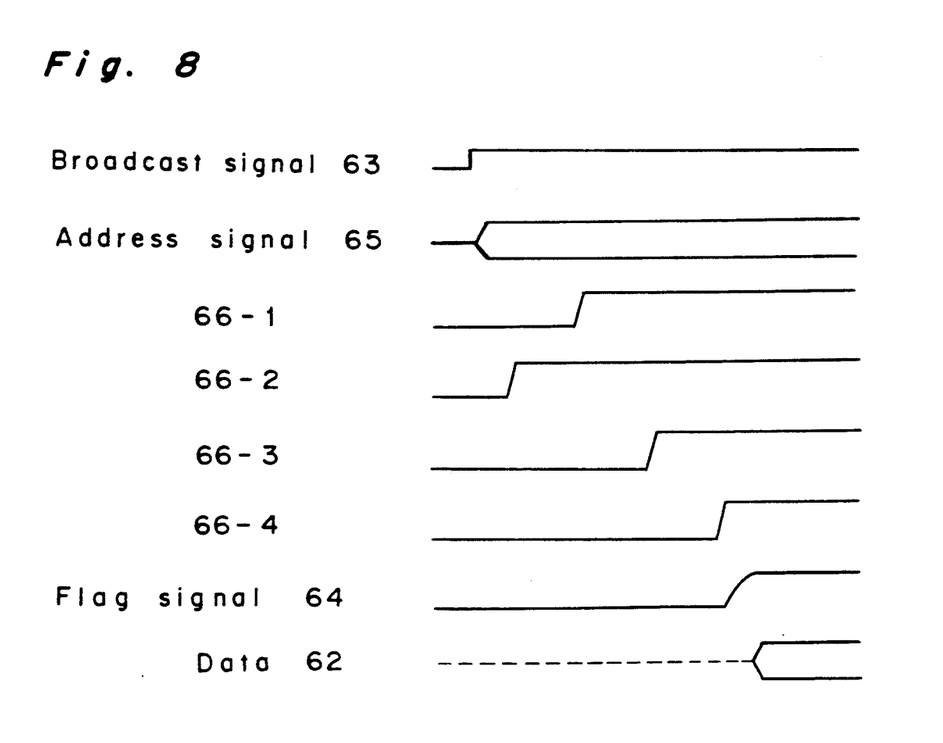
FIG. 8 is a chart showing an operation of the data transfer device of FIG. 6 at the time of broadcast transfer.

Meanwhile, if the broadcast signal 63 is at "H", namely, broadcast transfer is performed, the pull-up N type MOS transistor 74 of the processor element 60-1 is turned on and the output circuits 75 of all the crossbar switches 61-1a to 61-1d act as open drain type output circuits. In each of the crossbar switches 61-1a to 61-1d, the output circuit 75 outputs a high impedance state in response to each of signals 66-1 to 66-4 indicative of whether or not data reception is possible, which is outputted by the controller 76 in accordance with its internal state. When it has become possible to receive data in all the crossbar switches 61-1a to 61-1d, namely, outputs of all the output circuits 75 of the crossbar switches 61-1a to 61-1d have assumed a high impedance state, the flag signal 64 is pulled up to "H" by the pull-up N type MOS transistor 74 of the processor element 60-1. In response to this flag signal 64, the controller 72 of the processor element 60-1 requests the memory 73 to output data. In response to the request, data is outputted to the data bus 62 by the memory 73 and is received from the data bus 62 by all the crossbar switches 1-1a to 61-1d. FIG. 8 shows this broadcast transfer of the data transfer device 70.

As described above, in the data transfer device of the present invention, since the flag signals outputted from N data reception circuits (N=integer) are subjected to wired connection, the number of wires is reduced to 1/N of that of a data transfer device employing the tri-state type output circuits and a circuit for taking a logical product of the flag signals need not be provided, thereby resulting in large circuitry integration. Furthermore, regarding operational speed, since the output circuits act as tri-state type output circuits during one-to-one transfer occupying a major portion of data transfer, the data transfer device can be operated at a higher speed than a data transfer device employing the open drain type output circuits for reducing power consumption. Meanwhile, during a period other than that for broadcast transfer, since the pull-up circuit is turned off, power consumption of the data transfer device can be made smaller than that of the data transfer device employing the open drain type output circuits.

As is clear from the foregoing, in the output circuit of the present invention, when a signal supplied to a specific control input terminal is at a low level or at a high level, the output circuit acts as a tri-state type output circuit or an open drain type output circuit, respectively. Therefore, the tri-state type output circuit and the open drain type output circuit can be achieved by a single circuit.

Meanwhile, in the data transfer device of the present invention, the number of wires for the N flag signals is reduced to 1/N of that of a data transfer device employing the tri-state type output circuits and a circuit for taking a logical product of the flag signals is not required, thus resulting in large circuitry integration. Meanwhile, as compared with a data transfer device employing the open drain type output circuits, the data transfer device can be operated at a higher speed and with less power consumption.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An output circuit comprising:
   a data input for receiving a data input signal;
   a data output for generating a data output signal;
   a first control input for selectively causing said data output signal to be generated in accordance with either one of an ordinary type output circuit operation or an open drain type output circuit operation; and,
   a second control input for selectively setting said data output signal generated in accordance with said ordinary type output circuit operation to either one of an active state or an inactive state.

2. An output circuit as recited in claim 1, further comprising:
   a first control circuit having as first and second inputs said first and second control inputs, respectively, and having first and second outputs;
   a second control circuit having as first and second inputs said first output of said first control circuit and said data input, respectively, and having a first output;
   a third control circuit having as first and second inputs said second output of said first control circuit and said data input, respectively, and having a first output;
   a first switching element having a first data terminal coupled to a first power source, having a control terminal coupled to said first output of said second control circuit, and having a second data terminal coupled to said data output; and,
   a second switching element having a first data terminal coupled to said data output, having a control terminal coupled to said first output of said third control circuit, and having a second data terminal coupled to a second power source.

3. An output circuit as recited in claim 1, further comprising:
   a control circuit having as first and second inputs said first and second control inputs, respectively, and having first and second outputs;
   a logical circuit having first, second and third data input terminals and having an output coupled to said data output, said first data input terminal of said logical circuit coupled to said data input;
   a first switching element having a first data terminal coupled to a first power source, having a control terminal coupled to said first output of said control circuit, and having a second data terminal coupled to said second data input terminal of said logical circuit; and
   a second switching element having a first data terminal coupled to said third data input terminal of said logical circuit, having a control terminal coupled to said second output of said control circuit, and having a second data terminal coupled to a second power source.

4. A data transfer device comprising:
   a data transfer circuit, including an input circuit, from which a data line and a plurality of address lines are led, said input circuit having a pull-up circuit for setting an input signal line to a pull-up state by an output control line; and,
   a plurality of data reception circuits each including an output circuit;
   wherein outputs of said output circuits of said data reception circuits are commonly coupled to said input signal line;
   wherein said data line is commonly coupled to said data reception circuits and wherein said address lies are respectively coupled to said data reception circuits;
   wherein said output control line is led from said data transfer circuit and is commonly coupled to said data reception circuits;
   wherein each output circuit includes a data input for receiving a data input signal, a data output for generating a data output signal, a first control input for selectively causing said data output signal to be generated in accordance with either one of an ordinary type output circuit operation or an open drain type output circuit operation, and a second control input for selectively setting said data output signal generated in accordance with said ordinary type output circuit operation to either one of an active state or an inactive state;
   wherein said output control line is coupled to said first control input of each output circuit for controlling whether the data output signal is generated in accordance with an ordinary type output circuit operation or an open drain type output circuit operation, and wherein said address lines are respectively coupled to said second control inputs of said output circuits for controlling whether the data output signal is set to an active or inactive state.

5. An output circuit comprising:
   a data input terminal for receiving a data input signal;
   circuit means, coupled to said data input terminal and having first and second control inputs and a data output, for selectively operating in either of a first mode in which the data output is generated in accordance with an ordinary type output circuit operation and a second mode in which the output data is generated in accordance with an open drain type output circuit operation;

said circuit means operating in said first mode when a first mode control signal is applied to said first control input, and operating in said second control mode when a second mode control signal is applied to said first control input; and, said circuit means setting the data output to either an active state or an inactive state in accordance with a signal applied to said second control input.

* * * * *